US011227743B2

(12) United States Patent
Pilet et al.

(10) Patent No.: US 11,227,743 B2
(45) Date of Patent: Jan. 18, 2022

(54) ACCURATE WAVELENGTH CALIBRATION IN CATHODOLUMINESCENCE SEM

(71) Applicant: ATTOLIGHT AG, Lausanne (CH)

(72) Inventors: Julien Vincent Pilet, Renens (CH); Jean Berney, Lausanne (CH)

(73) Assignee: ATTOLIGHT AG, Lausanne (CH)

( * ) Notice: Subject to any disclaimer, the term of this patent is extended or adjusted under 35 U.S.C. 154(b) by 0 days.

(21) Appl. No.: 16/996,020

(22) Filed: Aug. 18, 2020

(65) Prior Publication Data
US 2021/0057183 A1 Feb. 25, 2021

Related U.S. Application Data

(60) Provisional application No. 62/889,434, filed on Aug. 20, 2019.

(51) Int. Cl.
*H01J 37/28* (2006.01)
*H01J 37/153* (2006.01)
*H01J 37/244* (2006.01)

(52) U.S. Cl.
CPC ............ *H01J 37/28* (2013.01); *H01J 37/153* (2013.01); *H01J 37/244* (2013.01); *H01J 2237/1534* (2013.01); *H01J 2237/24485* (2013.01)

(58) Field of Classification Search
CPC .. H01J 37/00; H01J 37/02; H01J 37/22; H01J 37/222; H01J 37/224; H01J 37/226; H01J 37/228; H01J 37/26; H01J 37/28; H01J 37/153; H01J 37/244; H01J 2237/1534; H01J 2237/24485; H01J 2237/2808; H01J 2237/2254; G01N 23/2254
USPC .......................................... 250/306, 307, 311
See application file for complete search history.

(56) References Cited

U.S. PATENT DOCUMENTS

| 3,845,305 | A |   | 10/1974 | Liebl |            |
|-----------|----|---|---------|-------------|--------------|
| 9,620,331 | B1 | * | 4/2017  | Bhattiprolu | H01J 37/261 |
| 2004/0011957 | A1 | * | 1/2004 | Yoshiki | G01N 23/227 |
|           |    |   |         |             | 250/307 |

(Continued)

FOREIGN PATENT DOCUMENTS

FR 2173436 10/1973

OTHER PUBLICATIONS

Huang, Xingyue et al. "A wavelength calibration process for micro-spectrometers with multichannel detectors", Advanced Materials and Devices for Sensing and Imaging III, edited by Anbo Wang, Yimo Zhang, Yukihiro Ishii, Proc. of SPIE vol. 6829, 68291Q (Jan. 24, 2008), 11 pages.

(Continued)

*Primary Examiner* — Jason L McCormack
(74) *Attorney, Agent, or Firm* — Womble Bond Dickinson (US) LLP; Joseph Bach, Esq.

(57) ABSTRACT

A scanning electron microscope having a spectrometer with a sensor having a plurality of pixels, wherein the spectrometer directs different wavelengths of collected light onto different pixels. An optical model is formed and an error function is minimized to find values for the model, such that wavelength detection may be corrected using the model. The model can correct for errors generated by effects such as the motion of the electron beam over the specimen, aberrations introduced by optical elements, and imperfections of the optical elements. A correction function may also be employed to account for effects not captured by the optical model.

22 Claims, 3 Drawing Sheets

(56) References Cited

U.S. PATENT DOCUMENTS

2007/0112529 A1* 5/2007 Bigarre ................ G01M 11/00
 702/59
2013/0335817 A1 12/2013 Isobe et al.
2016/0290862 A1 10/2016 Ikku
2019/0103248 A1 4/2019 Niu et al.

OTHER PUBLICATIONS

Macrae, Colin M. et al. "Quantitative Cathodoluminescence Mapping with Application to a Kalgoorlie Scheelite", Microscopy and Microanalysis 15(3)1222-230, copyright Microscopy Society of America (Jun. 2009).
Li, Pingxiang; Huanfeng, Shen; Zhang, Liangpei. "A method of image resolution enhancement based on the matching technique", State Key Laboratory of Information Engineering in Surveying, Mapping and Remote Sensing, Wuhan University, China (2004), 4 pages.
Lu, Weiguo; Fitchard, E.E.; Olivera, G.H.; You, J.; Ruchala, K.J.; Aldridge, J.S.; and Mackie, T.R. "Image/patient registration from (partial) projection data by the Fourier phase matching method", Phys. Med. Biol., vol. 44 (May 20, 1999), pp. 2029-2048.
Tsai, Tung-Hsien; Fan, Kuang-Chao; and Mou, Jong-I. "A variable-resolution optical profile measurement system", Institute of Physics Publishing, Meas. Sci. Technol., vol. 13 (2002), pp. 190-197.

* cited by examiner

ACCURATE WAVELENGTH CALIBRATION IN CATHODOLUMINESCENCE SEM

RELATED APPLICATIONS

This application claims priority benefit from U.S. Provisional Application, Ser. No. 62/889,434, filed Aug. 20, 2019, the disclosure of which is incorporated herein by reference in its entirety.

TECHNICAL FIELD

The present invention relates to cathodoluminescence scanning electron microscopes. In particular, but not exclusively, it relates to accurate wavelength calibration in cathodoluminescence scanning electron microscopes.

BACKGROUND

The light emitted by a specimen upon electron bombardment is called cathodoluminescence. Cathodoluminescence measurements can be performed in a scanning electron microscope (SEM) by scanning the highly focused electron beam probe of the electron microscope over the surface of the specimen and recording the cathodoluminescence signal intensity as a function of the electron beam position on the specimen. A cathodoluminescence map may be generated, which provides higher resolution spectroscopic information than would an equivalent image obtained using a conventional or laser-based light microscope.

In addition to the high spatial resolution of Cathodoluminescence SEM, the collected light may also be investigated for its spectral characteristics (cathodoluminescence spectroscopy). The collected spectrum can be measured for its intensity at each point of the scanned specimen. The study of the collected spectrum can provide information about the material of the specimen, its purity, the presence of defects, etc. Therefore, precisely determining the light intensity per wavelength or the wavelength collected at each pixel improves the accuracy of the information that can be inferred regarding the scanned sample.

However, there are several unaccounted for factors that contribute to and complicate the process of determining the mapping from pixels to wavelength. For example, during the scanning of the electron beam, as the electron beam moves across the specimen, the light emission point on the specimen moves as well. Consequently, the light spectrum on the camera sensor is displaced such that it is unclear which wavelength corresponds to which pixel. Also, the lenses of the optical light collection system inherently generate aberration, such as chromatic aberration. The system also includes concave mirrors which exhibit aberrations, as well as the camera sensor itself. These aberrations may cause irregular shifts in spectrum when the collected light beam deviates from the ideal optical axis. Therefore, it is necessary to correct for these aberrations in order to properly analyze the wavelength at each pixel of the camera sensor.

For further disclosures of systems incorporating light collection into a particle beam column, the reader is referred to: U.S. Pat. No. 3,845,305, U.S. Pub. Nos. 2013/0335817 and 2019/0103248, and French Pat. No. 2173436. One issue attempted to be addressed by these disclosures is how to incorporate all of the various particle and light optical elements in a small area so as to enable short working distance for high resolution. Conversely, the subject disclosure addresses the problem of identifying which pixel correlates with which wavelength of the collected light. The solution provided by the subject disclosure may be implemented in any Cathodoluminescence SEM, including those cited above.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

It is an aim of the present invention to overcome the problems identified above related to Cathodoluminescence SEM. In particular, it is the aim of the present invention to improve the accuracy of analysis results obtained using cathodoluminescence SEM by properly identifying wavelength peaks in the collected Cathodoluminescence emission.

According to a disclosed aspect, a physical model of the optical system is established. Unknown variables of the model are determined experimentally. Also, a polynomial with unknown coefficients is added to account for imperfections that are not modelled explicitly. The system is then used to measure multiple spectra from one or multiple calibration samples whose properties (i.e., emission peaks wavelengths) are known (e.g., scintillators, semiconductors, and semiconductor quantum dotes). All the peaks are identified in each spectra with subpixel accuracy. The detected peaks are then compared to the reference known peaks. An error function is then constructed and solved to find the values that minimize the error function. These values can be used to calibrate the system for testing any unknown material.

In disclosed embodiments, a cathodoluminescence SEM is provided, comprising: an electron column; a light collection optics within the column generating a light beam; a spectrometer having a light sensor with a plurality of pixels; a computer having a processor and a memory coupled to the processor to store instructions, which when executed by the processor, cause the processor to perform operations comprising: generating an electron beam and directing the electron beam onto a reference specimen having a known spectra and directing emitted cathodoluminescence light to the spectrometer; operating the spectrometer to obtain a plurality of cathodoluminescence spectra over the plurality of pixels; aligning each of the cathodoluminescence spectra to the known spectra; determining error values for each peak of each of the cathodoluminescence spectra to corresponding peak in the known spectra; using the error values to generate a calibration function.

Disclosed embodiments may further include a non-transitory machine-readable medium having instructions stored therein, which when executed by a processor, cause the processor to perform operations, the operations comprising: obtaining plurality of cathodoluminescence spectra of a known specimen from a plurality of pixels of a sensor; aligning each of the cathodoluminescence spectra to a reference spectra for the known specimen; determining error values for each peak of each of the cathodoluminescence spectra to corresponding peak in the reference spectra; using the error values to generate a calibration function.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

Other features and advantages of the invention will become apparent from the following description of non-limiting exemplary embodiments, with reference to the appended drawings, in which.

DETAILED DESCRIPTION

Some embodiments of the present invention are described below in more detail with reference to the attached figures. Identical functional and structural elements which appear in the different drawings are assigned the same reference numerals.

Embodiments of the inventive cathodoluminescence SEM calibration method will now be described with reference to the drawings. Different embodiments or their combinations may be used for different applications or to achieve different benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments, even if such are not explicitly described herein.

Figure 1:
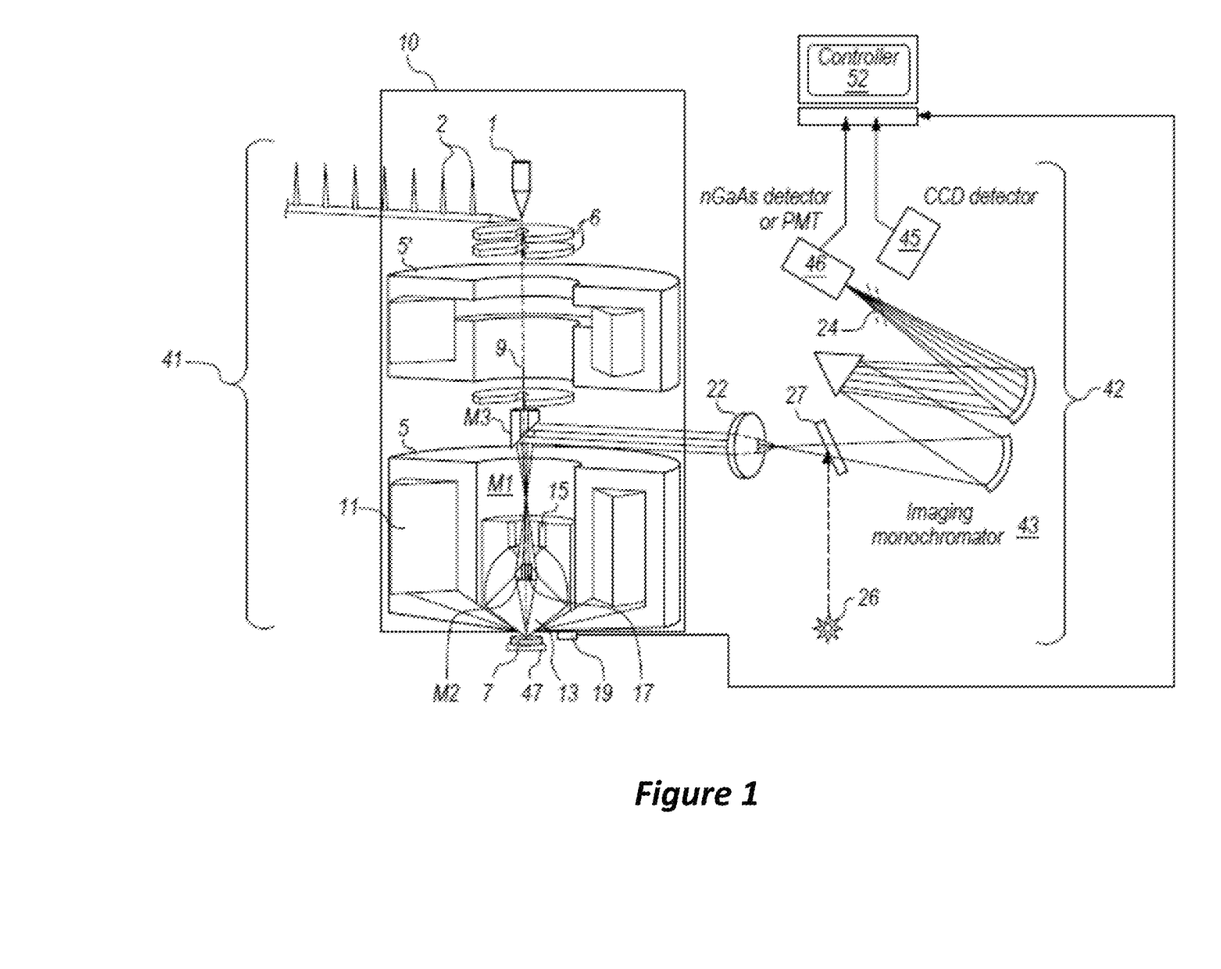
FIG. 1 is a schematic cross-sectional view of a lower portion of an electron microscope according to an embodiment.

FIG. 1 shows a cross-sectional view of a lower portion of a cathodoluminescence scanning electron microscope together with a sample or specimen 7. The microscope generally includes an electron column 41 that is housed within vacuum enclosure 10, and light imaging elements 42, which are in atmospheric environment. The integrated microscope shown in FIG. 1 can generate an electron beam image, a light beam image, a cathodoluminescence (CL) image, and a CL spectrographic image, but the description provided herein focuses on the spectrographic imaging. The imaged CL emissions can be correlated to the structure and quality of the sample's material at the nano-scale. The CL data can reveal material stress, impurities, crystallographic, and subsurface defects that are not visible using other imaging modes. Importantly, the CL imaging is a non-destructive method of inspecting a sample.

The electron column includes an electron source 1, such as a thermionic or field emission source, that emits electrons. The emitted electrons are made into electron beam 9 by the various particle-optics elements, such as electromagnetic lens 5', electromagnetic objective 5, and aperture disks (sometimes referred to as stops) 6. Note that any of the aperture disks 6 may function as an electrostatic lens by application of potential thereto. In FIG. 1, pulses 2 indicate that in this particular example the electron emission from the source 1 may be done in pulses, but this is not necessarily so. For example, emission may be done using continuous electron beam or shutters may be used to generate intermittent emission from a continuous electron beam.

In a known manner, coils 11 of electromagnetic objective lens 5 are provided to generate a magnetic field, in this figure a substantially horizontal magnetic field at the level of the optical axis of the electromagnetic objective lens 5. Most of the magnetic field may be located at the level of an output or exit aperture 13, or instead it could be outside of that region between the lens and the specimen 7. The purpose of the magnetic field is to generate a converging electron beam 9 which can be focused on to the surface of the sample 7. In this example, the electron beam 9, which is generated by the electron emitter 1, propagates from the top of the figure downwards. The electron beam span may be modified by a condenser arrangement, such as a lens 5', so that it can either diverge, be collimated or converge. The condenser means may be placed below the electron emitter.

The lens 5 has a hollow interior along its optical axis, so that the electron beam 9 can pass through. The hollow part (passage or gap) is wide enough so that light emitted by or reflected from the sample 7, as explained later, can also pass through without much obstruction. Since it is preferable to keep the output aperture 13 of the electromagnetic objective lens 5 as small as possible in order to keep good electron optical performance, it is preferable to build the system so that the working distance stays small.

As can be seen, a reflective objective is provided within the electromagnetic objective lens 5 for imaging the surface of the sample 7. In this example a Schwarzschild reflective objective is used. A Schwarzschild objective is a two mirror reflective objective, which is rotationally symmetric about the optical axis (essentially coinciding with the path of the electron beam), is aplanatic and infinity-corrected. In the context of geometrical optics, an objective is infinity-corrected if all light rays entering the objective parallel to the optical axis are focused onto the same focal point, forming a diffraction-limited spot, or conversely, all light rays emitted from the focal point and going through the objective form a bundle of light rays, or equivalently a collimated output beam, parallel to the optical axis. The electromagnetic objective lens 5 and the reflective objective may have the same focal plane.

An objective is aplanatic if it satisfies both the Abbe sine law and the Lagrange condition (also called Fermat principle). For an infinity-corrected objective, the Abbe sine law states that a light ray passing through the focal point and forming an angle $\alpha$ with the optical axis will exit the objective parallel to the optical axis and at a distance y' from the optical axis, so that y'=m×sin($\alpha$), where m is a real constant. This law should be satisfied at least in the vicinity of the focal point. For an infinity-corrected objective, the Lagrange condition states that the optical path followed by the light rays between the focal point and a plane which is orthogonal to the optical axis and placed within the collimated light beam, is constant, whatever the value of the angle $\alpha$.

The advantage of an aplanatic objective can be assessed using the theory of optical aberrations. Aberrations describe the deviation from ideality for an imaging optical system. An ideal imaging optical system is (1) stigmatic and (2) achromatic, i.e. (1) the image of a point, located at finite or infinite distance from the optical system, imaged by the optical system is a point (or more accurately a spot of which size is limited by diffraction of light), and (2) the position of the image point does not depend on the wavelength of light. The effect of aberrations on the imaging properties of an optical system is to deform the diffraction-limited image of a point object. A method (among others) to describe monochromatic aberrations was developed by Seidel. Here, aberrations are classified following their relative importance (as terms of an odd power series) and their effect on the image of a point source through the imaging optical system. The third-order terms of the power series describe the most basic aberrations (known as third-order aberrations) such as spherical and comatic aberrations, astigmatism, field curvature and distortion.

An aplanatic objective is corrected from spherical and comatic aberrations. The spherical aberration affects the image of a point object, independently of the on-axis or off-axis position of the object. On-axis and off-axis should be understood here as the rays that are emitted from an object on the optical axis, and the rays that are emitted from an object that is a distance off of the optical axis, respectively. An objective affected by spherical aberrations focuses the incident light rays at different positions along an axis parallel to the optical axis depending on the angle they make with the optical axis, resulting in a deviation from the otherwise diffraction-limited spot size of the image. Comatic aberration affects the image of a point object when the object is located off-axis. An objective affected by comatic aberrations focuses the incident light rays at different positions in a plane perpendicular to the optical axis depending on the angle they make with the optical axis and the position of the point object relative to the optical axis. The comatic aberration transforms the otherwise diffraction-limited circular symmetric spot into a comatic shaped spot.

There are advantages in working with an infinity-corrected objective. Firstly, because the rays exiting the objective are parallel to the optical axis, the image of the object can be formed at any axial distance along the optical axis, if another lens is added, for example. Secondly, it is possible to add optical elements such as plates, polarizers, spatial and spectral filters without any modification of the image location. A Schwarzschild reflective objective is calculated in such a way that it has the desired optical properties at its focal point. It is also aplanatic, which means that these properties will not change dramatically when departing from the focal point. It will keep a relatively good optical performance over a large field of view (up to a few degrees), i.e. light emitted off-axis from a point within the focal plane will produce an output beam which is nearly collimated. Conversely, a collimated beam entering the objective with a relatively large angle (up to a few degrees) will form a spot on the focal plane, which is relatively small (nearly diffraction-limited).

The reflective objective within the electromagnetic objective 5 comprises a first mirror M1, also referred to as the primary mirror, which in this example is spherical and concave, and a second mirror M2 also referred to as the secondary mirror, which in this example is spherical and convex. The diameter of the first mirror M1 is larger than the diameter of the second mirror M2. The first mirror M1 is located above the second mirror M2 and is arranged to reflect the light coming from the sample as a result of the electron beam 9 hitting the surface of the sample 7, and to direct the light towards the second mirror M2 placed between the sample and the first mirror M1. The second mirror M2 is arranged to redirect the light along the optical axis of the electromagnetic objective, and a third mirror, M3, which in this example is planar, is arranged to redirect the light beam 4 towards an output. In this example the third mirror M3 has a 45° angle with respect to the electron beam 9 axis and is used to redirect the light out of the vacuum enclosure 10. All the three mirrors M1, M2 and M3 have an aperture or opening along the electron beam path so that the electron beam is not obstructed.

In operation, to obtain the spectra of light emitted from the sample, the electron emitter 1 or probe generates an electron beam 9 and the electron beam produced by the electron emitter is transformed into a collimated, focused or divergent electron beam by means of a collimating lens 5' located in the trajectory of the electron beam 9. The electromagnetic objective lens 5 generates a magnetic field at an output aperture 13 of the electromagnetic objective lens 5 for focusing the electron beam to a sample 7, while deflectors 15, 17 deviate the electron beam 9, thus enabling it to perform a scan over the sample 7. The reflective objective, mounted axially along the electron beam 9 and within the electromagnetic objective lens 5, collects light from the sample 7. The light collected from the sample is redirected to the third mirror M3, which further redirects the light out of the vacuum enclosure 10. The collected light is passed through a monochromator to spatially separate the light into its wavelengths components, and the intensity of light at a selected wavelength is detected.

In the example of FIG. 1 two imagers may be provided: one from a CCD camera 45, which is a two-dimensional detector, and one from a point detector 46, such as an InGaAs or PMT detector. If mirror 24 is a half mirror, then both imagers can be operated simultaneously. Conversely, mirror 24 may be a flip mirror, enabling one imager at a time. With this arrangement, detector 46 can be used to detect light intensity of a specified wavelength, while CCD camera may be used to detect light intensity at several wavelengths simultaneously. This disclosure relates specifically to an arrangement which detects light intensity at several wavelengths simultaneously, such as by using a CCD. Note that the term "imagers" is used rather loosely here, as the system does not generate an image per se, but rather detects light intensity at specific wavelengths.

Figure 2:
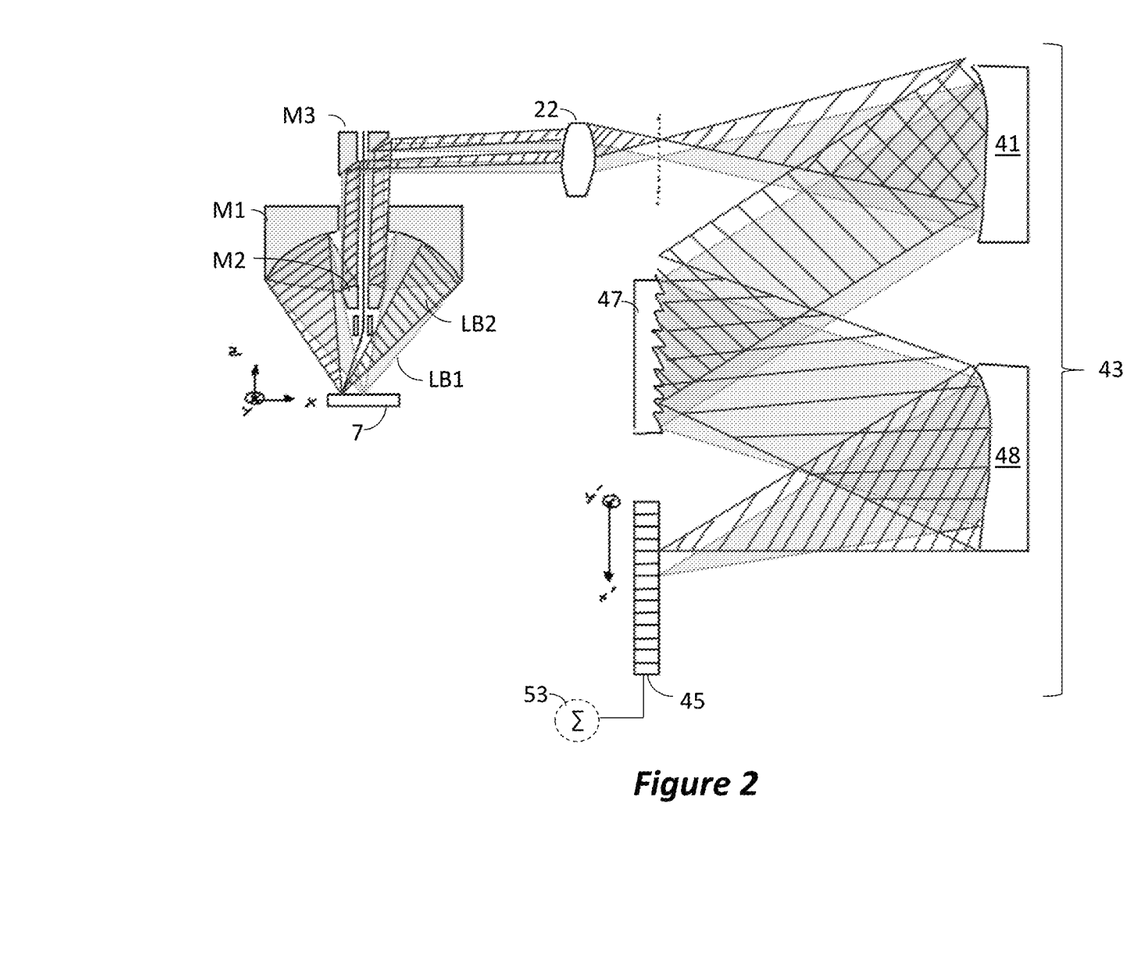
FIG. 2 is a schematic cross-sectional view of a lower portion of an electron microscope highlighting elements for understanding of disclosed embodiments.

FIG. 2 is a general schematic illustrating certain elements of the system shown in FIG. 1, for clearer explanation of problems associated with the cathodoluminescence monochromator. Light emanating from sample 7 is collected by the objective (formed by mirrors M1 and M2) and directed out of the column by mirror M3. It then passes through lens 22 and reflected by concave mirror 41 towards grating 47. Grating 47 separates the beam into its wavelength components, which are directed towards the second concave mirror 48. From mirror 48 the light is directed towards the sensor 45, e.g., CCD. Because the light beam has been separated into its wavelength components, different wavelengths will be sensed by different pixels of sensor 45. That is, while coordinates (x,y) indicate the spatial location of the light emission from sample 7, coordinates—or pixel location with respect to coordinates—(x',y') indicate the intensity (peak) of a particular wavelength emitted from location (x,y) on the sample. Note that while sample 7 and sensor 45 are shown in two dimensions, they are three dimensional objects, with coordinate y going into the page.

Since the imaging monochromator 43 translates positional coordinates on the sample into a wavelength indication on the sensor, it is important to know which pixel on the sensor represents which wavelength. Unfortunately, the mapping is not consistent between measurements. FIG. 2 illustrates two beams emanating from the sample, beam LB1 indicated without hatch marks and emanating from a central location with respect to the optical objective (i.e., on axis), and beam LB2 indicated with hatch marks and emanating from a location that is offset with respect to the objective (i.e., off axis). As illustrated in FIG. 2, a shift in position of emission on the sample with respect to the optical axis causes a shift in position on the sensor, even if both beams are of the same wavelength. This means that the correspondence between wavelength and pixels has shifted, so that it is not clear which pixel represent which wavelength. That is, both a change in a wavelength and a change in the position of the light source would cause a shift on the sensor. Consequently, the identity of a particular wavelength sensed by a particular pixel is ambiguous.

Accordingly, the system needs to be characterised to understand how a particular spatial shift in light emission effects the position of a particular wavelength peak on the sensor. However, other effects also need to be corrected in order to increase the accuracy of the correlation between pixels and wavelengths. For example, all of the optical elements, such as the objective, the lenses, the mirrors and the grating introduce aberrations, as detailed above with respect to FIG. 1 and the optical elements. These aberrations introduce a non-linear behaviour in the shift of a wavelength location on the sensor.

In disclosed embodiments solutions are developed to improve the accuracy of correspondence between wavelength and pixel location on the sensor. In an embodiment, a solution is provided by generating a mathematical function that translates a position on the sample and a selected pixel on the sensor and predicts which wavelength peak would be sensed by that pixel of the sensor. Generally the model can be represented by a function in the form:

$$F(x,y,l,X) \to \lambda$$

In this particular example, the function determines for an x and y position of the electron beam (which is the same as the light emission location on the sample), which wavelength would be observed by pixel 1 on the sensor, wherein X is a vector of unknown model parameters. Alternatively, the model may be set to indicate for an x and y position of the electron beam and specified wavelength κ, which pixel 1 on the sensor will receive the peak, i.e., $F(x,y,\lambda,X) \to 1$. Of course the solution of one approach can be used to approximate the solution for the other approach, so the following description proceeds using the first approach, but can be easily used for the second approach as well.

In order to determine the values for the unknown model parameters, measurements are taken of multiple spectra from one or multiple calibration materials whose light emission properties are known. Generally, three kinds of samples may be used for calibration: scintillators, semiconductors, and semiconductor quantum dotes. Scintillators include an atom with discrete transition level (typically a rare earth such as Nd, Er, Yb, Y, etc.) in an otherwise wide band gap matrix that doesn't influence its light emission. Examples include Nd:YAG, Yb:YAG, Yb:YVO), Er:YAG, Ruby ($Cr:Al_2O_3$), Ce:YAG, and LUAG:Pr. Semiconductor material or an alloy with an exactly known composition may be used at the near band edge (NBE) emission. Examples include GaAs and its alloys (Ga,Al)As, (Ga,In)As, GaN and its alloys (also with In and Al), CdTe, CdSe, pure diamond, pure silicon, InP, GaP. Semiconductor quantum dot may include (CdS, InS, CdSe, CdTe, PbS, InAs) or multi quantum wells (GaN/InGaN, GaN/AlGaN, GaAs/InGaAs, GaAs/AlGaAs, InP/AlGaP).

(e.g., Ruby, Nd-YAG, etc.). The multiple spectra should be taken at multiple configurations of the system that simulate normal usage of the system. In one example, the peaks in all of the spectra are detected at sub-pixel accuracy.

Figure 3:
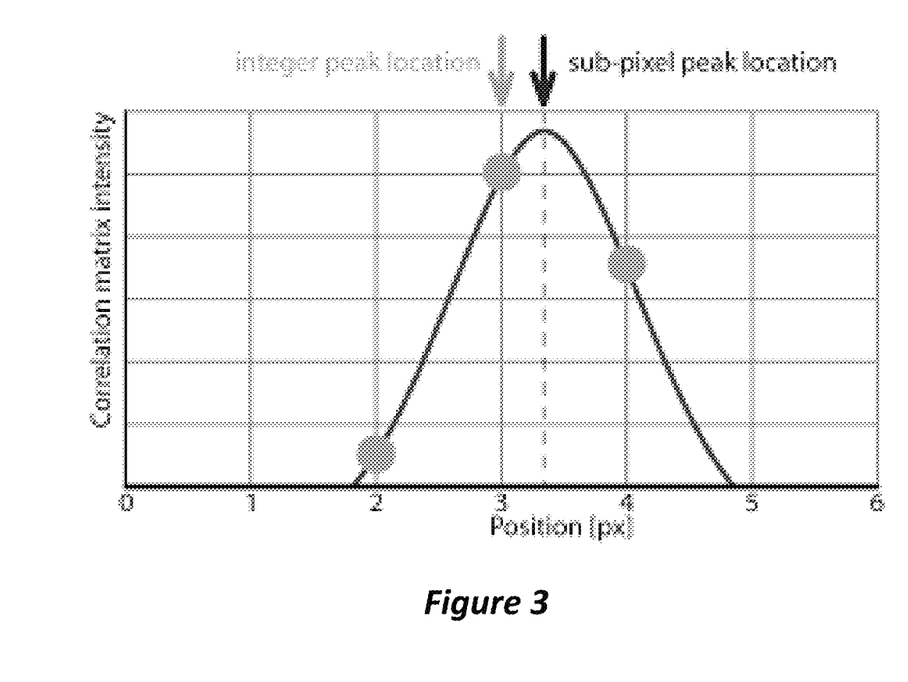
FIG. 3 is a plot of generating sub-pixel resolution according to an embodiment.

In that respect, any general method for generating sub-pixel resolution may be used. For example, this may be done by fitting a quadratic curve through the measured points of the peaks, as exemplified by FIG. 3. See also, e.g., Weigue Lu, E. E. Fitchard, G. H. Olivera, J. You, K. J. Ruchala, J. S. Aldridge and T. R. Mackie, "Image/patient registration from (partial) projection data by the Fourier phase matching method", Phys. Med. Biol., vol. 44, 2029-2048, 1999; Tung-Hsien Tsai, Kuang-Chao Fan and Jong-I Mou, "A variable resolution optical profile measurement system", Meas. Sci. Technol., vol. 13, 190-197, 2002; and Li. Pingxiang, Sh. Huanfeng, Zh. Liangpei "A method of image resolution enhancement based on the Matching technique", State Key Laboratory of Information Engineering in Surveying, Mapping and Remote Sensing, Wuhan University, China, 2004.

The peaks obtained experimentally are then identified among a set of reference known peaks using standard methods, e.g., random sample consensus (RANSAC), highest peak, or other methods. The output of this step is a set of detected peaks indicating at beam position (x, y), the known peak with wavelength lambda appears at location 1 on the sensor. Once the obtained sample is aligned, an error function is constructed for all unknown and coefficients of the model. For all the peaks recognized by the alignment, the error function may correspond to the difference between the predicted wavelength at the location of the recognized peaks and the corresponding reference wavelength. This error function may be expressed as a sum of the square differences between predicted and measured wavelengths:

$E(X) = \Sigma_i (F(x_i,y_i,l_i,X) - w_i)^2$, wherein $w_i$ is the reference wavelength for detected peak i, $(x_i,y_i)$ is the beam position on the sample, and $l_i$ is sub-pixel position on the sensor.

Some peaks may fail to align with the reference and therefore noted as non-recognized. It is possible to include non-recognized peaks in the model by constructing the error function for non-recognized peaks as the difference between the predicted wavelength at the location of the non-recognized peak and the closest peak among all the reference peaks. This error function can be expressed as:

$E(X) = \Sigma_i [\min_j (F(x_i,y_i,l_i,X) - w_j)^2]$, where the set $\{w_j\}$ contains the all reference peak candidates for detected peak i.

The optimal parameters for the model are obtained by finding the values for X that minimize the error function. Any method for minimizing the error function may be used. In one embodiment, the method of least square is utilized, as it minimizes the sum of the squared residual: the difference between an observed value and the fitted value provided by the reference. In one example, the Levenberg-Marquardt algorithm (LMA), also known as the damped least-squares (DLS) method, is used since the model of the optical elements leads to a non-linear least squares problems.

It is possible that the minimizer may be unable to find an X that would make the error function sufficiently close to zero. This may be because the function F(X) does not properly model the system due to, e.g., it is rather complicated to model imperfection of the mirrors which introduce small effects that are difficult to predict. Therefore, in another embodiment the model is supplemented with a correction function. In one example, the correction function is a polynomial. The new expression would model the correlation between the position of the electron beam and the error, i.e., F'(x,y,l,X,X'), wherein X'=coefficients of the correction function. When using a polynomial as the correction function, the model may be expressed as:

$F(x,y,l) + a^*x + b^*x + c^*y + d^*y^2 + e^*x^*y$, wherein $X' = [a,b,c,d,e]$.

This correction function introduces correction as the beam moves away from the optical axis center (x=0,y=0), and introduces corrections that may not be explainable by modelling the system. The correction function produces a null when the cathodoluminescence spectra is obtained from a point of the specimen that is aligned with, i.e., intersecting, the optical axis of the microscope. Therefore, in this embodiment the expanded model F' is used in the error function to obtain improved results when applying the minimizer.

Returning to FIGS. 1 and 2, and with reference to the above discussion, a method according to an embodiment may proceed as follows. A specimen 7 is positioned within the focal plane of the electron microscope. The electron beam 9 is focused in such a way that a narrow beam having a probe size of less than 1 μm is produced and is capable of generating a cathodoluminescence response on a small area of the specimen. Considering the very small emission volume of the cathodoluminescence, it is appropriate to simplify explanations and to approximate the resulting emission as being diffraction-limited, and consequently, the resulting emission volume can be considered as a single point on the surface of the specimen, having coordinate (x,y), which is provided by the controller of the electron beam scanner.

Cathodoluminescence is collected by an imaging reflective objective (Schwarzschild in this embodiment) and focused onto the entrance place of spectrometer 43, in this example, a Czerny Turner spectrometer with a refractive lens or a refractive objective. The Czerny Turner spectrometer diffracts light onto a camera sensor 45. The camera 45 consists of a matrix of pixels represented by a Cartesian coordinate system x',y'. It is oriented in such a way that light is dispersed along x' (y being into the page and having no dispersion). Since dispersion occurs along one dimension, it is also possible to use a linear, one-dimensional, pixel array.

The grating 47 of the spectrometer disperses light with various diffraction orders. It behaves like a mirror at the zeroth diffraction order. The Cartesian coordinate system (x,y) is arbitrarily chosen to represent the position of the electron beam on the specimen so that the x and y axis is imaged onto the x' and y' axis respectively at the zeroth diffraction order. Here, (x=0,y=0) may be considered to coincide with the optical axis of the electron column.

Ideally, the full optical system (Schwarzschild+refractive objective+spectrometer) would have perfect imaging properties, in which case the position on the camera would be expressed as (x',y')=Γ(x,y), and Γ would be the optical magnification of the optical system. In practice, the model is more complicated and additional terms (second order, third order, etc.) need to be added to describe it. Moreover, the coefficients of the model may change as a function of the wavelength λ since the system is not achromatic. These effects are non-linear with respect to displacement away from the optical axis of the optical spectrometer system.

The dispersion of the spectrometer along the x' axis can be calculated using the spectrometer equation, so that the wavelength of each pixel on the camera is determined from the geometry of the spectrometer and the properties of the dispersive grating. The spectrometer equation takes into account geometrical parameters such as the focal length of the spectrometer, the orientation of the camera relative to the optical axis, the orientation of the grating relative to the incoming and refracted optical axis, the pixel size, and the grating groove density.

As exemplified above, the wavelength at each pixel can be modeled from the geometry of the optical system and the position (x,y) of the electron beam on the specimen, as well as the above mentioned parameters, including the optical magnification and any other parameters taken into account (i.e. optical aberrations, polynomial component of x, y or λ, etc.).

Considering that spectral dispersion only happens in one direction, it is possible to sum all of the pixels on the camera along the y' direction to increase the signal-to-noise ratio, and to measure a one-dimensional array of data representing the spectrum. This is exemplified by optional adder 53 illustrated in FIG. 2. The adder 53 transforms the two-dimensional matrix pixel data into a linear vector having entries for light intensity added along one dimension (row or column). Each entry of the vector corresponds to a specific wavelength of cathodoluminescence emitted from the sample. Alternatively, it is also possible to use a linear, one-dimensional, pixel array.

The parameters can be obtained through the following means: a known specimen having known sharp spectroscopic lines may be selected from the examples listed above, e.g., scintillators, semiconductors, or semiconductor quantum dotes. The spectrum is measured for various beam positions (x,y) over different spectral ranges and for each pre-selected calibration crystal. The model is then fitted over all data so that the best set of parameters representing most accurately the data is produced. Preferably, large data sets are produced to improve the fit accuracy. For instance, hyperspectral maps can be acquired for the crystals over a large field of view with a resolution of 32×32 pixels or higher.

After calibration, the wavelength detected at each pixel is always known and can be determined from the beam position (x,y) and the grating orientation for any unknown sample.

While the invention has been illustrated and described in detail in the drawings and foregoing description, such illustrations and descriptions are to be considered illustrative or exemplary and not restrictive, the invention being not limited to the disclosed embodiments. Other embodiments and variants are understood, and can be achieved by those skilled in the art when carrying out the claimed invention, based on a study of the drawings, the disclosure and the appended claims.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used. Any reference signs in the claims should not be construed as limiting the scope of the invention.

The invention claimed is:

1. A method for calibrating a cathodoluminescence microscope, comprising:
    placing a reference specimen having a known spectra at a focal point of the microscope and obtaining plurality of cathodoluminescence spectra over plurality of pixels of a sensor;
    aligning each of the cathodoluminescence spectra to the known spectrum;
    determining error values for each peak of each of the cathodoluminescence spectra to corresponding peak in the known spectrum;
    using the error values to generate a calibration function.

2. The method of claim 1, wherein obtaining plurality of cathodoluminescence spectra comprises detecting all the peaks of the spectra to a sub-pixel accuracy.

3. The method of claim 2, wherein detecting all the peaks of the spectra to a sub-pixel accuracy is performed by fitting a quadratic curve through measured points of the peaks.

4. The method of claim 1, wherein determining error values comprises constructing an error function of a model of the cathodoluminescence microscope.

5. The method of claim 4, wherein using the error values comprises minimizing the error function to obtain values for the model.

6. The method of claim 5, further comprising including a correction function in the error function.

7. The method of claim 6, wherein the correction function is a polynomial.

8. The method of claim 6, wherein the correction function produces a null when the cathodoluminescence spectra is obtained from a point of the specimen aligned with optical axis of the microscope.

9. The method of claim 8, wherein the correction function produces higher values as the cathodoluminescence spectra is obtained from points further from the point of the specimen aligned with optical axis of the microscope.

10. The method of claim 4, wherein the model is expressed as a function of spatial coordinates on the sample and a specified pixel to generate expected wavelength of the spectra.

11. The method of claim 10, wherein the model further includes a correction function having a plurality of coefficients.

12. The method of claim 11, further comprising using the error values to determine values to the plurality of coefficients.

13. The method of claim 4, wherein the model is expressed as a function of spatial coordinates on the sample and a specified wavelength to generate expected pixel sensing the specified wavelength.

14. The method of claim 1, further comprising adding the pixels of the sensor in one direction to generate a linear vector of pixel values.

15. A cathodoluminescence scanning electron microscope comprising:
   an electron column;
   a light collection optics within the column generating a light beam;
   a spectrometer having a light sensor with a plurality of pixels;
   a computer having a processor and a memory coupled to the processor to store instructions, which when executed by the processor, cause the processor to perform operations comprising:
     generating an electron beam and directing the electron beam onto a reference specimen having a known spectra and directing emitted cathodoluminescence light to the spectrometer;
     operating the spectrometer to obtain a plurality of cathodoluminescence spectra over the plurality of pixels;
     aligning each of the cathodoluminescence spectra to the known spectra;
     determining error values for each peak of each of the cathodoluminescence spectra to corresponding peak in the known spectra;
     using the error values to generate a calibration function.

16. The cathodoluminescence scanning electron microscope of claim 15, wherein the computer further comprises an error function minimizer.

17. The cathodoluminescence scanning electron microscope of claim 15, wherein the memory further stores a mathematical model of the light collection optics and spectrometer.

18. The cathodoluminescence scanning electron microscope of claim 17, wherein the mathematical model is expressed as a function of spatial coordinates on the sample and a specified pixel to generate expected wavelength of the spectra.

19. The cathodoluminescence scanning electron microscope of claim 17, wherein the memory further stores a correction function.

20. The cathodoluminescence scanning electron microscope of claim 15, further comprising an adder receiving the plurality of pixels and generating a linear vector of pixel values.

21. A non-transitory machine-readable medium having instructions stored therein, which when executed by a processor, cause the processor to perform operations, the operations comprising:
   obtaining plurality of cathodoluminescence spectra of a known specimen from a plurality of pixels of a sensor;
   aligning each of the cathodoluminescence spectra to a reference spectra for the known specimen;
   determining error values for each peak of each of the cathodoluminescence spectra to corresponding peak in the reference spectra;
   using the error values to generate a calibration function.

22. The non-transitory machine-readable medium of claim 14, wherein the operations further comprise minimizing an error function to obtain values for an optical model.

* * * * *